United States Patent [19]

Westerman et al.

[11] 4,041,331
[45] Aug. 9, 1977

[54] SOLID STATE RELAY CIRCUIT

[75] Inventors: David J. Westerman; Louis S. McTamaney, both of San Jose; David J. Kauber, Redwood City, all of Calif.

[73] Assignee: FMC Corporation, San Jose, Calif.

[21] Appl. No.: 499,942

[22] Filed: Aug. 23, 1974

[51] Int. Cl.² .............................................. H03K 17/78
[52] U.S. Cl. ........................... 307/252 Q; 307/252 B; 307/311; 307/315
[58] Field of Search ........... 307/252 B, 252 N, 252 Q, 307/311, 315

[56] References Cited

U.S. PATENT DOCUMENTS

| | | | |
|---|---|---|---|
| 3,723,769 | 3/1973 | Collins | 307/252 B |
| 3,743,860 | 7/1973 | Russell | 307/252 B |
| 3,761,912 | 9/1973 | Stettner et al. | 307/252 B |
| 3,848,140 | 11/1974 | Guermeur et al. | 307/311 X |

Primary Examiner—John S. Heyman
Attorney, Agent, or Firm—R. S. Kelly; C. E. Tripp

[57] ABSTRACT

A solid state circuit providing the function of a ratchet relay which circuit is relatively immune from noise and is capable of high speed switching operation. The circuit is adapted to receive an AC input trigger signal and convert such signal into an appropriate signal for alternately firing a pair of triacs that are each serially connected with a load and an AC power source. The circuit includes an input section comprising an AC to DC pulse converter, a time delay network, and a pulse shaping circuit which provide a clean input pulse to trigger a flip-flop and an output section including an opto-isolated Darlington transistor pair which is provided with a separate power supply and which operates to alternately fire the triacs in response to the output state of the flip-flop.

13 Claims, 1 Drawing Figure

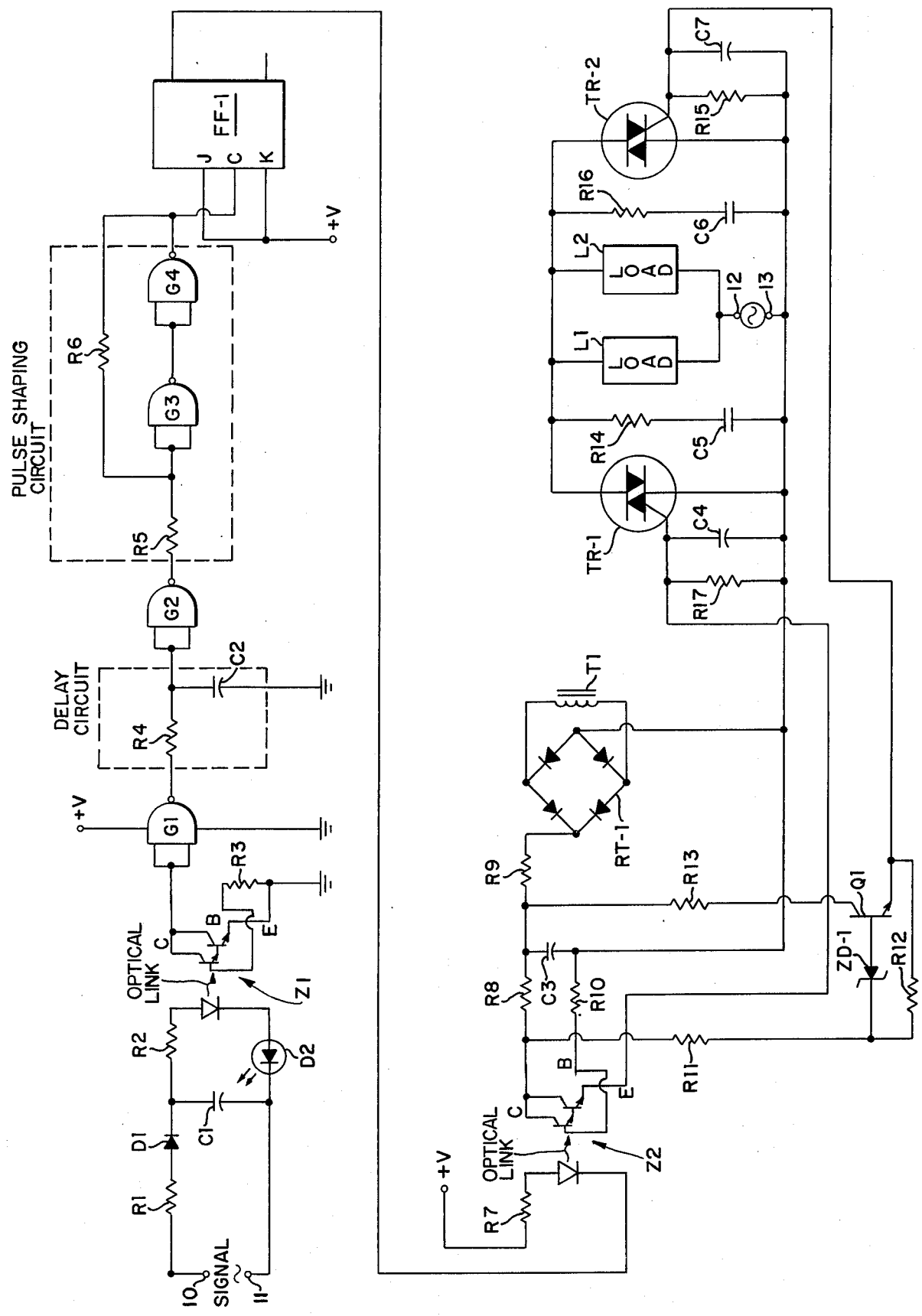

SOLID STATE RELAY CIRCUIT

BACKGROUND OF THE INVENTION

1. Field of the Invention

The present invention pertains to solid state relay circuits, and more particularly, it pertains to relay circuits of the impulse-sequence type wherein successive triggering pulses cause the relay to toggle between its activated and unactivated conditions.

2. Description of the Prior Art

With the advent of thyristor devices of high current carrying capabilities, such as the SCR and the triac, a considerable variety of solid state relay circuits have been devised to provide switching functions formerly provided by electromechanical relays. There has not been readily available, however, a solid state relay circuit of the impulse-sequence or ratchet-impulse type where successive triggering impulses cause the relay to change its state. Problems are encountered in designing such a circuit to handle available triggering impulse signals and yet be relatively free from noise and other mistriggering problems. Furthermore, such circuits must be capable of high speed switching operation with both resistive and inductive loads.

SUMMARY OF THE INVENTION

With the present invention a solid state relay circuit of the impulse-sequence type is provided. This circuit is arranged to receive an input triggering impulse, which may be comprised of several cycles of an AC wave, and shape such input signal so as to provide a squared input pulse to a conventional toggle flip-flop. The output of the flip-flop has two states which alternate upon successive input pulses, and this output is coupled by means of an opto-isolated switch to the gate of the thyristor which is to deliver power to the load. By providing the opto-isolated switch with a separate power supply, noise generated in the load circuit is not present in the input section of the relay circuit.

In the relay circuit of the preferred embodiment, a pair of thyristors are connected to the opto-isolated switch so that they will be operated in opposition to each other being alternately triggered into conduction on successive input signals.

With the circuitry of the present invention a relatively inexpensive solid state relay is provided which eliminates the reliability problems of the conventional electromechanical ratchet relay devices and, furthermore, is capable of operation at considerably higher speeds. The relay circuit of the present invention can function with either inductive or resistive loads with no rapid aging of the relay. The relay is capable of ready adjustment for different AC or DC input trigger voltages and, in the event of a malfunction, it can be readily repaired.

BRIEF DESCRIPTION OF THE DRAWING

The single FIGURE of the drawing is an electrical schematic diagram of a circuit which embodies the present invention.

DESCRIPTION OF THE PREFERRED EMBODIMENT

Referring now more particularly to the Drawing it will be seen that the circuitry of the present invention is designed to receive AC triggering impulse signals at input terminals 10 and 11 and to convert such signals into suitable gate triggering impulses to alternately trigger triacs TR-1 and TR-2 into conduction to alternately provide an AC current for loads L1 and L2, respectively. The circuit of the present invention basically includes (1) an input section which converts the received AC triggering signals into DC signals and shapes such DC signals into clean square wave input signals for toggling a flip-flop circuit FF-1 and (2) an output circuit which alternately applies triggering pulses to the gates of the triacs TR-1 and TR-2 in accordance with the output state of flip-flop FF-1.

As pointed out, the input signals are arranged to be received at the input terminals 10 and 11. In the disclosed embodiment of the invention these input triggering signals, which are comprised of several cycles of an AC line voltage, are filtered through an AC to DC converter network comprised of resistor R1 and capacitor C1 and are rectified by a diode D1. The rectified and filtered pulses are directed through a current-limiting resistor R2 to an optically isolated switch Z1. The switch element Z1 comprises an opto-isolated Darlington transistor pair with the collector, base and emitter connections of the transistor circuit being indicated in the Drawing. This opto-isolated switch element may, for example, comprise a prepackaged opto-electronic circuit such as circuit MCA2-30 manufactured by Monsanto Commercial Products Company of Cupertino, Calif. which circuit contains a gallium arsenide infrared emitter optically coupled to a silicon planar photo-darlington. The DC current from resistor R2 travels through Z1 and a light emitting diode D2 which is used to visibly indicate when trigger current is present. An optical connection is present within the switch element Z1 to turn on the Darlington transistor and provide an output signal at the collector lead. If desired, a straight DC signal can be used at the input with diode D1, resistor R1 and capacitor C1 then not being necessary. If very low voltage DC input pulses are used, the diode drops through D2 and the light emitting element in Z1 must be considered, but a DC voltage as low as 2.5 volts (with 10 milliamp current to Z1) can safely be used. This means that the relay can be controlled directly from a TTL logic signal input.

The Darlington transistor pair in the opto-isolated switch Z1 is biased by resistor R3, and the output signal therefrom is supplied to a gate G1. This Darlington transistor pair converts the input trigger signal to a high threshold logic level (HTL) suitable for driving the gate G1 which comprises a conventional NAND gate wired as an inverter and serving to isolate the input trigger signal from the following circuit components. Gate G1 is powered from a DC voltage source +V. The signal from gate G1 is passed through a time delay network comprised of a resistor R4 and a capacitor C2. This network provides a delay time for both the leading and trailing edges of the triggering pulses to make the relay insensitive to noise on the input trigger signal such as contact bounce. On the leading edge of the trigger pulse, capacitor C2 is charged by resistor R4 and a resistor within the gate circuitry G1. On the trailing edge of the trigger pulse, capacitor C2 discharges through resistor R4 to ground. Thus, it will be appreciated that there is a greater time delay on the leading edge of the trigger pulse than on the trailing edge of the pulse as determined by the relative values of the resistor R4 and the resistance in the gate G1. If a more equal time delay is desired so that the pulse time is not distorted, the value of resistor R4 may be increased so that the effect of the resistor in the gate G1 is minimized. A second inverting NAND gate G2 is connected to the output of the time delay network C2-R4 and serves to further isolate the input signal from the other components of the input section of the relay.

A second pair of inverting NAND gates G3 and G4 and a pair of resistors R5 and R6 form a standard pulse shaping circuit to provide clean square wave input pulses to the flip-flop FF-1.

The flip-flop circuit is the primary functional element in the relay circuit of the present invention and serves as the control for the output stage. The flip-flop is a conventional J-K flip-flop with the inputs and outputs connected so that the flip-flop will toggle on successive input pulses. Thus, the J and K inputs are tied to the DC voltage source indicated at the terminal +V, and the clock input serves as the input for the pulses from the gate G4 of the pulse shaping network. Only one output from the flip-flop is required to alternately trigger the triacs TR-1 and TR-2 into conduction. In order that the flip-flop have a "memory" function similar to the nonvolatile memory provided by the conventional electromechanical ratchet relays, the supply voltage +V could be provided by a separate, noninterruptable power supply (such as from a battery) which can be maintained even though all other power for operating the relay circuit is lost, e.g., when the line voltage is cut off.

The output of the flip-flop FF-1 is directed to a second optically isolated switching element Z2 which comprises an optically coupled Darlington transistor network similar to or the same as the switch element Z1 previously discussed. Current through switch Z2 is limited by a resistor R7 and is supplied by a voltage source +V. The transistor output stage of Z2 includes its own separate power supply which is provided by the secondary of a transformer T1. This isolated power supply is necessary in order to keep noise from the load circuits in the output stage from being transmitted back into the input stage of the relay through the power supplies. Power supplied by transformer T1 is passed through a full wave rectifier RT-1 and a filtering network comprising the combination of a resistor R9 and capacitor C3. The negative side of the power supply from transformer T1 is made common with the primary terminals of the triacs TR-1 and TR-2 and with one of the terminals 13 of the AC line voltage source, the other terminal 12 of the line voltage source being connected to both of the loads L1 and L2. On the positive side of the power supply a resistor R8 limits the current through the Darlington pair in Z2 which, when turned on, triggers the gate of the triac TR-1. When the Darlington pair of Z2 is turned off, the voltage between the collector thereof and the resistor R8 is raised higher than the voltage set by a Zener diode ZD-1 so as to direct a current through current-limiting resistor R11 to the base input of a transistor Q1 and allow a triggering current to be conducted through the current limiting resistor R13 to trigger the gate of the second triac TR-2. The transistor Q1 thereby serves as a secondary switching element to switch the triggering current to the gate of TR-2 when the primary switching element Z2 is not conducting. In designing the relay circuit of the present invention, resistors R8 and R13 must be larger than resistor R9 and their time constant with respect to the capacitor C3 must be larger than the time constant of the R9-C3 filtering network. A resistor R10 provides a ground path for the base current in the transistor circuit of Z2, and a resistor R12 is connected between the gate lead and the emitter of transistor Q1 so that this transistor will turn off sharply when the Darlington pair within element Z2 is switched on. It should be noted that current from either Z2 or Q1 must be flowing to one of the gate leads of the triacs TR-1 and TR-2 so that one triac will be on at all times regardless of the type of load. When the gate current of each triac is extinguished, the triac will turn off as the line voltage passes through zero.

Each of the triacs TR-1 and TR-2 is provided with similar compensating circuits. Resistors R15 and R17 are used to drain off the stored charge that would be collected by a floating gate thereby making the triacs less sensitive to sudden changes in voltage. Capacitors C4 and C7 are used to pass any noise spikes from the power supply of the switch element Z2 to the main terminals of the triacs bypassing the gates so that the triacs will not misfire. Resistor R14 and capacitor C5 and resistor R16 and capacitor C6 form common snubber networks that prevent triac misfire due to sudden voltage variations in the line voltage applied between terminals 12 and 13.

With the aforedescribed circuitry of the present invention, it will be seen that a solid state ratchet relay is provided which utilizes no moving parts and which can be constructed relatively inexpensively. Isolated elements are used throughout the circuit to prevent any noise that may be generated in one part of the circuit from affecting another part of the circuit, and the relay circuit can therefore be used with high reliability in any industrial environment. Also, the relay circuit can operate in the desired manner whether the loads L1 and L2 are inductive or resistive. A circuit constructed in the manner described has been operated at speeds up to 600 cycles per minute with protection from triac misfire for one-half cycle of a conventional 60 Hertz AC voltage source. By using a clean input trigger signal, the relay can be used with a 400 Hertz voltage source with switching speeds of up to 10,000 cycles per minute. Thus, the solid state relay of the present invention can clearly be operated at much greater speeds than can any of the conventional electromechanical ratchet relays which it is designed to replace. Furthermore, the solid state relay of the present invention has a long useful life with no rapid aging such as is the case with the prior art electromechanical relays. Both AC or DC input triggering signals can be accepted.

Although the best mode contemplated for carrying out the present invention has been herein shown and described, it will be apparent that modification and variation may be made without departing from what is regarded to be the subject matter of the invention.

What is claimed is:

1. A solid state relay circuit of the alternating impulse type comprising a thyristor having a pair of primary terminals and a gate terminal; means for connecting a load and an AC source voltage in series with said primary terminals; and a triggering circuit connected to said gate terminal for triggering the thyristor into conduction to provide a current to said load, said triggering circuit comprising means for receiving an input trigger signal, a pulse shaping circuit connected to said last named means for shaping said input trigger signal into a squared pulse, a toggle flip-flop having two output states connected to the output of said pulse shaping circuit, said flip-flop being connected to said pulse shaping circuit so as to provide alternate output states for successive input pulses, and an optically isolated switch connected between the output of said flip-flop and said gate terminal of said thyristor, said switch having a power supply separate from the power supplies for the other components in said triggering circuit.

2. A solid state relay circuit as set forth in claim 1 wherein said switch comprises a transistor.

3. A solid state relay circuit as set forth in claim 2 wherein said switch comprises a pair of transistors connected in the Darlington configuration with the base input thereto being optically connected with the output of said flip-flop.

4. A solid state relay circuit as set forth in claim 1 wherein said input trigger signal is an AC signal and said means for receiving said input trigger signal comprises an AC to DC converter.

5. A solid state relay circuit as set forth in claim 1 wherein said pulse shaping circuit includes an optically isolated switch, a time delay circuit, and a pulse squaring circuit.

6. A solid state relay circuit as set forth in claim 5 wherein said optically isolated switch comprises a transistor with the base input thereto being optically connected with the output of said means for receiving said input trigger signal.

7. A solid state relay circuit of the alternating impulse type comprising a pair of thyristors each having a first and a second primary terminal and a gate terminal; a pair of loads each being connected in series with said first primary terminal of one of said thyristors; means for connecting an AC source voltage in series with said second primary terminals of said thyristors; and a triggering circuit connected to said gate terminals for alternately triggering said thyristors into conduction to alternately provide currents to said loads, said triggering circuit comprising means for receiving an input trigger signal, a pulse shaping circuit connected to said last named means for shaping said input trigger signal into a squared pulse, a toggle flip-flop having two output states connected to the output of said pulse shaping circuit, said flip-flop being connected to said pulse shaping circuit so as to provide alternate output states for successive input pulses, an optically isolated switch connected between the output of said flip-flop and the gate terminals of said thyristors, a power supply for said optically isolated switch separate from the power supplies for the other components in said triggering circuit, and a secondary switching element connected between said optically isolated switch and one of said gate terminals to provide a gate activating current at said one gate terminal when said optically isolated switch is not conducting a gate activating current to the other of said gate terminals and to block the gate activating current to said one gate terminal when said optically isolated switch is conducting a gate activating current to said other gate terminal.

8. A solid state relay circuit as set forth in claim 7 wherein said optically isolated switch comprises a first transistor with the base input thereto being optically connected with the output of said flip-flop and wherein said secondary switching element comprises a second transistor with the base input thereof being connected between said power supply and the collector input of said first transistor, and means in said base input of the second transistor for biasing said second transistor off when said first transistor is conducting.

9. A solid state relay circuit as set forth in claim 8 wherein said thyristors comprise triacs.

10. A solid state relay circuit as set forth in claim 7 wherein said input trigger signal is an AC signal and said means for receiving said input trigger signal comprises an AC to DC converter.

11. A solid state relay circuit as set forth in claim 10 wherein said pulse shaping circuit comprises a second optically isolated switch connected to receive the output of said AC to DC converter.

12. A solid state relay circuit as set forth in claim 11 wherein said pulse shaping circuit further includes a time delay circuit and a pulse squaring circuit serially connected between said second optically isolated switch and said flip flop.

13. A solid state relay circuit as set forth in claim 11 wherein said second optically isolated switch comprises a pair of transistors connected in the Darlington configuration with the base input thereto being optically connected with the output of said AC to DC converter.

* * * * *